(12) United States Patent
Ting et al.

(10) Patent No.: US 11,018,284 B2
(45) Date of Patent: May 25, 2021

(54) LIGHT EMITTING ELEMENT AND ELECTRONIC DEVICE

(71) Applicant: InnoLux Corporation, Miao-Li County (TW)

(72) Inventors: Chin-Lung Ting, Miao-Li County (TW); Li-Wei Mao, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/355,854

(22) Filed: Mar. 18, 2019

(65) Prior Publication Data

US 2019/0326486 A1    Oct. 24, 2019

Related U.S. Application Data

(60) Provisional application No. 62/659,790, filed on Apr. 19, 2018.

(30) Foreign Application Priority Data

Sep. 27, 2018   (CN) .......................... 201811133544.X

(51) Int. Cl.
*H01L 33/52* (2010.01)
*H01L 31/0216* (2014.01)
*G02B 27/09* (2006.01)

(52) U.S. Cl.
CPC .......... *H01L 33/52* (2013.01); *G02B 27/0977* (2013.01); *H01L 31/02164* (2013.01)

(58) Field of Classification Search
CPC ... H01L 33/52; H01L 33/44; H01L 31/02164; G02B 27/0977
See application file for complete search history.

(56) References Cited

U.S. PATENT DOCUMENTS

| 2007/0212802 | A1* | 9/2007 | Lee | ........................ | H01L 33/54 438/22 |
| 2009/0250718 | A1* | 10/2009 | Chang | ..................... | H01L 33/54 257/100 |
| 2009/0321759 | A1* | 12/2009 | Xu | .......................... | H01L 33/54 257/98 |
| 2011/0316006 | A1* | 12/2011 | Xu | ........................ | H01L 27/156 257/88 |
| 2012/0007130 | A1* | 1/2012 | Hoelen | ................. | H01L 33/504 257/98 |

(Continued)

FOREIGN PATENT DOCUMENTS

| CN | 102694103 A | 9/2012 |
| EP | 2 851 971 A1 | 3/2015 |

(Continued)

*Primary Examiner* — Christine A Enad
(74) *Attorney, Agent, or Firm* — Winston Hsu

(57) ABSTRACT

A light emitting element includes a package substrate, a first light-emitting diode chip, an encapsulation material and a light-shielding layer. The first light-emitting diode chip is disposed on the package substrate, the encapsulation material is disposed on the first light-emitting diode chip and the package substrate, and the light-shielding layer is disposed on the encapsulation material and has a first opening. In a top-view direction, the area of the first opening of the light-shielding layer is less than the area of the light emitting element.

16 Claims, 6 Drawing Sheets

(56) References Cited

U.S. PATENT DOCUMENTS

| | | | |
|---|---|---|---|
| 2012/0068211 A1* | 3/2012 | Wu | B29C 45/14655 |
| | | | 257/98 |
| 2012/0098005 A1* | 4/2012 | Chan | H01L 33/507 |
| | | | 257/98 |
| 2013/0099661 A1* | 4/2013 | Gasse | H05B 33/12 |
| | | | 313/512 |
| 2014/0077682 A1* | 3/2014 | Ho | H05B 33/02 |
| | | | 313/117 |
| 2014/0175491 A1* | 6/2014 | Sanga | H01L 33/505 |
| | | | 257/98 |
| 2015/0076534 A1* | 3/2015 | Terakami | H01L 25/0753 |
| | | | 257/89 |
| 2016/0190400 A1 | 6/2016 | Jung | |
| 2016/0247984 A1 | 8/2016 | Liu | |
| 2017/0270852 A1 | 9/2017 | Meitl | |
| 2018/0083171 A1 | 3/2018 | Liu | |
| 2018/0331078 A1* | 11/2018 | Gould | H01L 25/075 |

FOREIGN PATENT DOCUMENTS

| | | |
|---|---|---|
| JP | 2016-149386 A | 8/2016 |
| TW | 201513401 A | 4/2015 |

\* cited by examiner

US 11,018,284 B2

LIGHT EMITTING ELEMENT AND ELECTRONIC DEVICE

CROSS REFERENCE TO RELATED APPLICATION

This application is a non-provisional application of U.S. Provisional Patent Application No. 62/659,790, filed Apr. 19, 2018, which is incorporated herein by reference in its entirety.

BACKGROUND OF THE DISCLOSURE

1. Field of the Disclosure

The present disclosure relates to a light emitting element and related electronic device, and particularly to a light emitting element and related electronic device that can increase light emitting efficiency.

2. Description of the Prior Art

Public information display (PID) is a commonly used outdoor display device. In order to solve the problem of low contrast ratio of the displayed image resulted from the reflection of sun light, the conventional light-emitting diodes (LED) used in the PID adopt black encapsulation material. However, since the light-emitting diode chip is covered by black encapsulation material, a certain proportion of the produced light will be absorbed by the black encapsulation material. Accordingly, the light emitting efficiency is reduced, and the whole luminance of the PID is lowered. Therefore, it is still an issue for the manufacturer to improve the light utilization ratio.

SUMMARY OF THE DISCLOSURE

An embodiment of the present disclosure provides a light emitting element that includes a package substrate, a first light-emitting diode chip, an encapsulation material and a light-shielding layer. The first light-emitting diode chip is disposed on the package substrate, the encapsulation material is disposed on the first light-emitting diode chip and the package substrate, and the light-shielding layer is disposed on the encapsulation material and has a first opening. In a top-view direction, the area of the first opening of the light-shielding layer is less than the area of the light emitting element.

Another embodiment of the present disclosure provides an electronic device that includes a main substrate and at least a light emitting element. The main substrate includes a circuit and a plurality of connection pads. The circuit and the plurality of connection pads are all disposed on the main substrate surface. The light emitting element is disposed on the main substrate and electrically connected with at least one of the plurality of connection pads. The light emitting element includes a package substrate, a light-emitting diode chip, an encapsulation material and a light-shielding layer. The light-emitting diode chip is disposed on the package substrate, the encapsulation material is disposed on the light-emitting diode chip and the package substrate, and the light-shielding layer is disposed on the encapsulation material and has an opening. In a top-view direction, the area of the opening of the light-shielding layer is less than the area of the light emitting element.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
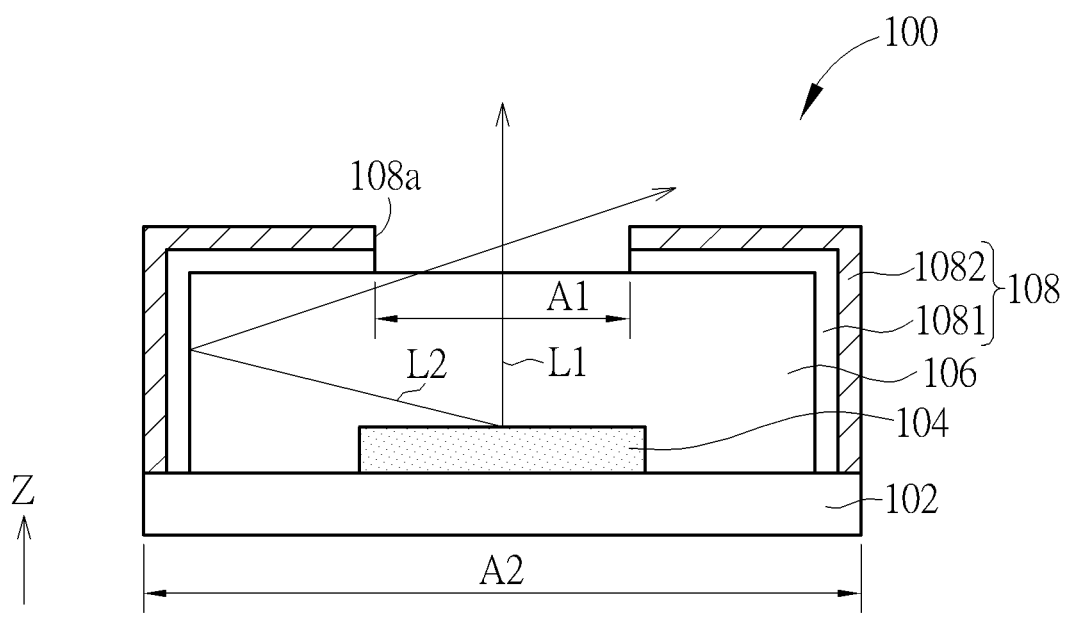
FIG. 1 is a schematic sectional-view of alight emitting element according to a first embodiment of the present disclosure.
Figure 2:
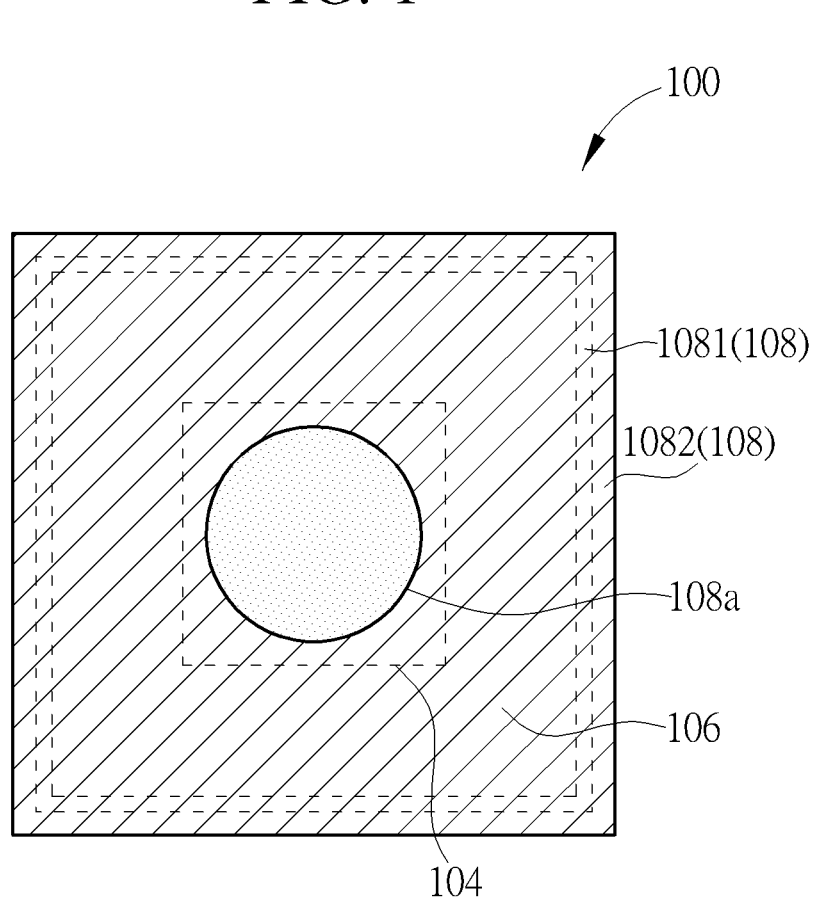
FIG. 2 is a schematic top view of the light emitting element according to the first embodiment of the present disclosure.

Referring to FIG. 1 and FIG. 2, FIG. 1 is a schematic sectional-view of a light emitting element according to a first embodiment of the present disclosure, and FIG. 2 is a schematic top view of the light emitting element according to the first embodiment of the present disclosure. The light emitting element 100 of this embodiment is a light emitting diode (LED) package and includes a package substrate 102, a light-emitting diode chip 104, an encapsulation material 106 and a light-shielding layer 108. The package substrate 102 may include insulating material layer(s) and conductive material layer(s) (not shown), wherein the conductive material layer(s) may form conductive lines, electrodes, connection pads, or other suitable elements in the package substrate 102, but not limited thereto. For example, the color of the surface of the package substrate 102 of this embodiment may be a light color or white that can increase light reflection ratio; alternatively, the surface of the package substrate 102 is formed of the material with high light reflectivity, but not limited thereto. The light-emitting diode chip 104 is disposed on the surface of the package substrate 102, and the bottom of the light-emitting diode chip 104 may be electrically connected with the conductive lines of the package substrate 102 through solder or other suitable conductive material. The encapsulation material 106 covers the surfaces of the light-emitting diode chip 104 and the package substrate 102 and can protect or fix the light-emitting diode chip 104. The encapsulation material 106 may include transparent materials or the materials with high light-transparency, which indicates that the materials are transparent or have high transparency corresponding to the wavelength range of the light emitted by the light-emitting diode chip, such as epoxy based resin, silicon or other suitable material. The refraction index of the encapsulation material 106 may be in a range from 1.4 to 1.7 ($1.4 \leq$ refraction index $\leq 1.7$), or from 1.5 to 1.6 ($1.5 \leq$ refraction index $\leq 1.6$), but not limited thereto. The light-shielding layer 108 covers and encloses the encapsulation material 106, and the light-shielding layer 108 has an opening 108a on its top surface corresponding to the encapsulation material 106. In a top-view direction, the opening 108a of the light-shielding layer 108 in this embodiment overlaps at least a portion of the light-emitting diode chip 104, i.e., at least a portion of the light produced by the light-emitting diode chip 104 will directly emit out through the opening 108a without reflection. In this embodiment, the area (represented by the symbol "A1" in FIG. 1) of the opening 108a is less than the area (represented by the symbol "A2" in FIG. 1) of the package substrate 102. In other embodiments, the area A1 of the opening 108a in the top-view direction is less than the package structure of the light emitting element 100. In this embodiment, the opening 108a has a round shape, but not limited thereto. In other embodiments, the opening 108a may have other various suitable geometric shapes, such as square.

In this embodiment, the light-shielding layer 108 has a double-layer structure that includes a light reflective layer 1081 and a light absorption layer 1082, wherein the light reflective layer 1081 is disposed between the light absorption layer 1082 and the encapsulation material 106. The light reflective layer 1081 includes the material with a high reflectivity ratio. For example, the reflective ratio may be in a range from 70% to 100% ($70\% \leq$ reflective ratio $<100\%$). In other embodiments, its reflective ratio may be in a range from 90% to 100% ($90\% \leq$ reflective ratio $<100\%$). The material with high reflectivity can effectively reflect the light that progresses to its surface. The material with high reflectivity may be, for example, white or have a light color, but not limited thereto.

As an example, the light absorption layer 1082 may be a material with low reflectivity that can effectively absorb the light progressing to its surface. The light absorption layer 1082 may be black or have a dark color. For instance, the light absorption layer 1082 may be a black adhesive, but not limited thereto. As an example, the reflectivity of the light absorption layer 1082 may be in a range from 0% to 30% ($0\%<$ reflectivity $\leq 30\%$). In other embodiments, its reflectivity may be in a rage from 10% to 0% ($0\%<$ reflectivity $\leq 10\%$), but not limited thereto. In some embodiments, the surface of the light absorption layer 1082 may suffer a roughening treatment to form a rough surface or have a textured structure that can scatter light, for further reducing the light reflectivity. The light reflective layer 1081 and the light absorption layer 1082 may be formed on the surface of the encapsulation material 106 through twice injection molding processes or spray/sputter processes respectively, but the formation method of the light reflective layer 1081 and light absorption layer 1082 are not limited thereto. From the above, the double-layer structure of the light-shielding layer 108 have an inner layer and an outer layer, wherein the inner layer is the light reflective layer 1081, and the outer layer is the light absorption layer 1082. Since the light-shielding layer 108 has the opening 108a and the inner layer is the light reflective layer 1081, a portion (L1) of the light emitted by the light-emitting diode chip 104 can directly emit out of the light emitting element 100 through the opening 108a of the light-shielding layer 108, and another portion (L2) of the light emitted by the light-emitting diode chip 104 may be reflected once, twice or more times by the light reflective layer 1081 before emitting out through the opening 108a. Accordingly, the light reflective layer 1081 as the inner layer of the light-shielding layer 108 can increase the utilization efficiency of light. In addition, when the area of the opening 108a is less than the package substrate 102, the light may be concentrated to the opening 108a to exit the light emitting element 100, and therefore the light utilization efficiency may be further increased. In another aspect, the outmost light absorption layer 1082 of the light emitting element 100 can absorb the light that progresses to the outer surface of the light emitting element 100, thus it can effectively reduce the reflection of ambient light when the light emitting element 100 is applied to a public information display, any outdoor display device or any electronic device used in an environment with high ambient light. Accordingly, the image contrast ratio may be increased.

The light emitting diode (LED) mentioned in the present disclosure may include inorganic light emitting diode (normal LED), mini light emitting diode (mini LED), micro light emitting diode (micro LED), organic light emitting diode (OLED), quantum dot (QD) light emitting diode (QLED or QD-LED) or any combinations thereor, but not limited thereto. This embodiment takes the mini LED as an example, and the light emitting diode elements 100 in the following embodiments and variant embodiments also adopt the mini LED for example with no repeated description.

The electronic device of the present disclosure is not limited by the aforementioned embodiment, and may have other different preferred embodiments and variant embodiments. To simplify the description, the identical components in each of the following embodiments and variant embodiments are marked with identical symbols. For making it easier to compare the difference between the embodiments and variant embodiments), the following description will detail the dissimilarities among different embodiments and variant embodiments and the identical features will not be repeatedly described. In addition, the material and thickness of each film or layer and related fabrication process or conditions of the present disclosure may refer to the first embodiment, which will not be repeated.

Figure 3:
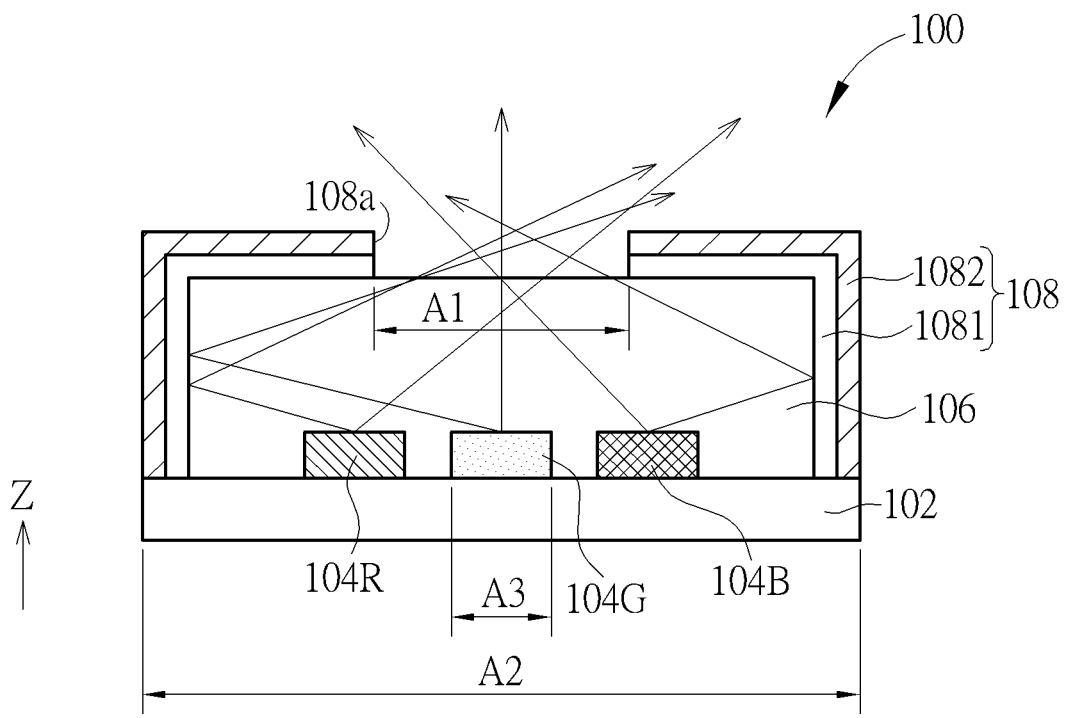
FIG. 3 is a schematic sectional-view of a light emitting element according to a second embodiment of the present disclosure.

Referring to FIG. 3, FIG. 3 is a schematic sectional-view of a light emitting element according to a second embodiment of the present disclosure. This embodiment and the first embodiment are different mainly in that the light emitting element 100 of this embodiment includes three light-emitting diode chips 104R, 104G, 104B disposed on the surface of the package substrate 102. The light-emitting diode chips 104R, 104G, 104B can respectively produce lights with different colors. For example, the light-emitting diode chips 104R, 104G, 104B may respectively produce red light, green light and blue light, but not limited thereto. When the light emitting element 100 of this embodiment is applied to an electronic device, the light-emitting diode chips 104R, 104G, 104B are electrically connected with an external circuit through the conductive material layer of the package substrate 102, such that the external circuit can control the light-emitting diode chips 104R, 104G, 104B individually to emit light simultaneously or non-simultaneously. For example, in some cases, the light emitting element 100 may produce red light, green light or blue light at different times respectively in some cases; and in some other cases, two or three of the light-emitting diode chips 104R, 104G, 104B may produces lights at the same time. In this embodiment, the area A1 of the opening 108a of the light-shielding layer 108 is less than the area (represented by the area A2 of the package substrate 102) of the light emitting element 100 in a top-view direction. With cooperation of the disposition of the light reflective layer 1081 and the encapsulation material 106, when two or three of the light-emitting diode chips 104R, 104G, 104B produce lights at the same time, the produced lights can be reflected back to the encapsulation material 106 by the light reflective layer 1081 and then emit out of the light emitting element 100 through the opening 108a with a smaller area. Accordingly, the lights can be mixed before emitting out of the light emitting element 100, thus the chromatic performance may be improved. In this embodiment, the area A1 of the opening 108a is designed to be greater than the area A3 of the light-emitting diode chips 104R, 104G or 104B in the top-view direction. However, in other embodiments, the area A1 of the opening 108a may be less than the area A3 of the light-emitting diode chip 104R, 104G or 104B. In addition, the positions of the light-emitting diode chips 104R, 104G, 104B related to the opening 108a may be designed based on the light-emitting efficiencies, chromatic performances of the light-emitting diode chips 104R, 104G, 104B, and/or perception of human eyes. For example, if the light-emitting efficiency of the light-emitting diode chip 104G is lower than that of the light-emitting diode chips 104R, 104B, or the perception of human eyes to the light-emitting diode chip 104G is lower, the light-emitting diode chip 104G can be designed to have a greater overlapping area with the opening 108a in the top-view direction, while the overlapping areas of the light-emitting diode chips 104R, 104B with the opening 108a may be smaller in the top-view direction. Accordingly, most of the light produced by the light-emitting diode chip 104G can directly emit out through the opening 108a, but most lights produced by the light-emitting diode chips 104R, 104B will be reflected by the light reflective layer 1082 and then emit out through the opening 108a. By this design, the chromatic performance of different color of lights may be more uniform.

Figure 4:
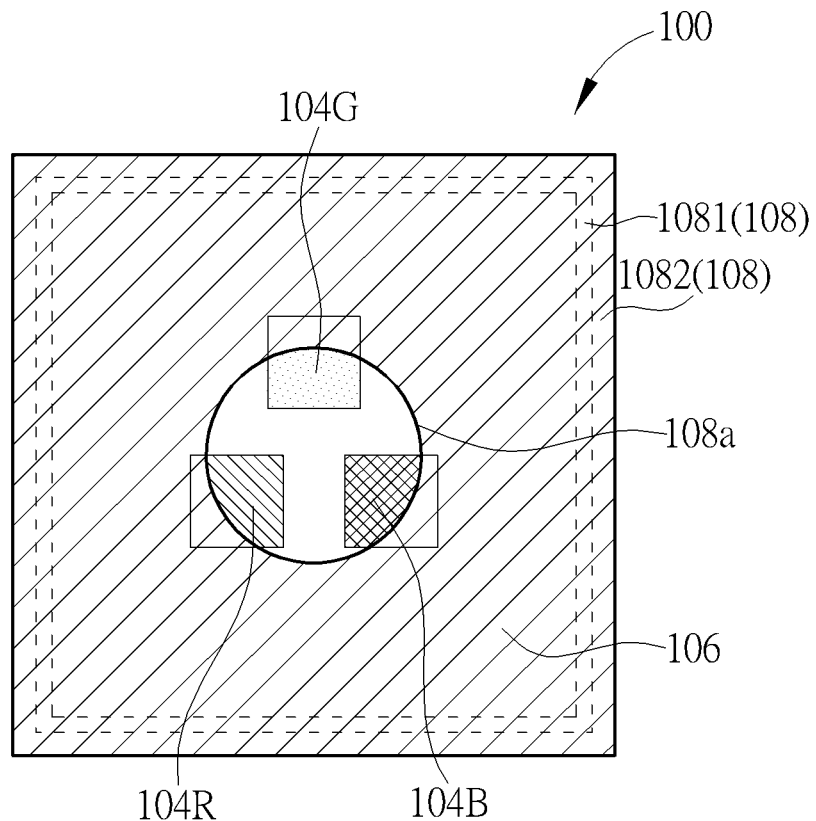
FIG. 4 is a schematic top view of a light emitting element according to a variant embodiment of the second embodiment of the present disclosure.
Figure 5:
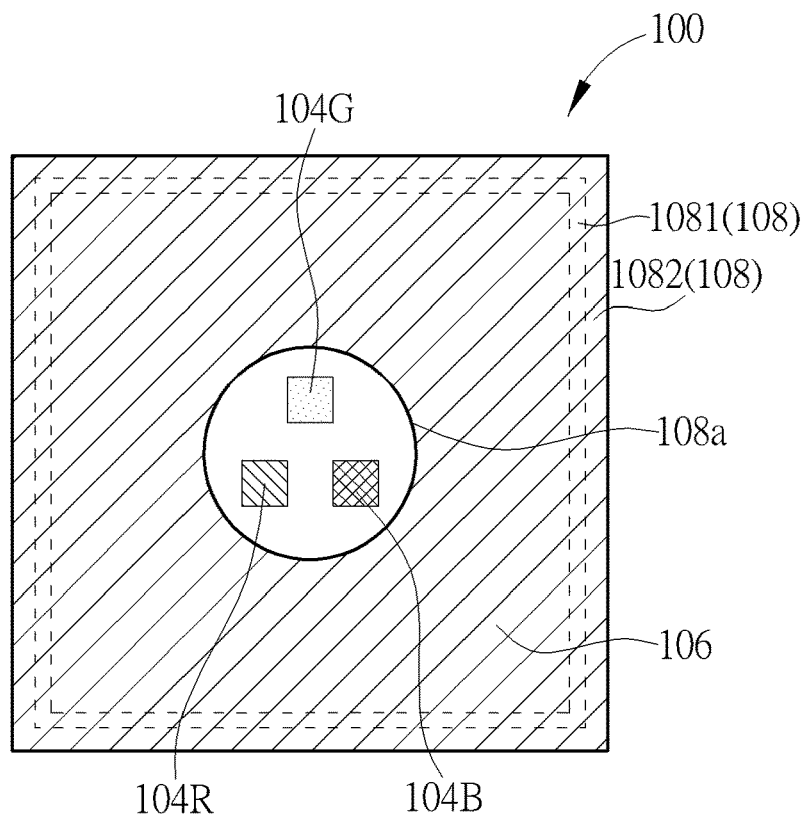
FIG. 5 is a schematic top view of a light emitting element according to another variant embodiment of the second embodiment of the present disclosure.

Referring to FIG. 4, FIG. 4 is a schematic top view of a light emitting element according to a variant embodiment of the second embodiment of the present disclosure. In this variant embodiment, the opening 108a overlaps at least a portion of the projections of the three light-emitting diode chips 104R, 104G, 104B respectively. Referring to FIG. 5, FIG. 5 is a schematic top view of a light emitting element according to another variant embodiment of the second embodiment of the present disclosure. The opening 108a of the light emitting element 100 in FIG. 5 may be greater than the sum of the areas of the light-emitting diode chips 104R, 104G, 104B, and the light-emitting diode chips 104R, 104G, 104B are all disposed within the opening 108a in the top-view direction. This design makes most of the lights produced by the light-emitting diode chips 104R, 104G, 104B emit through the opening 108a directly, and therefore the luminance may be increased.

Figure 6:
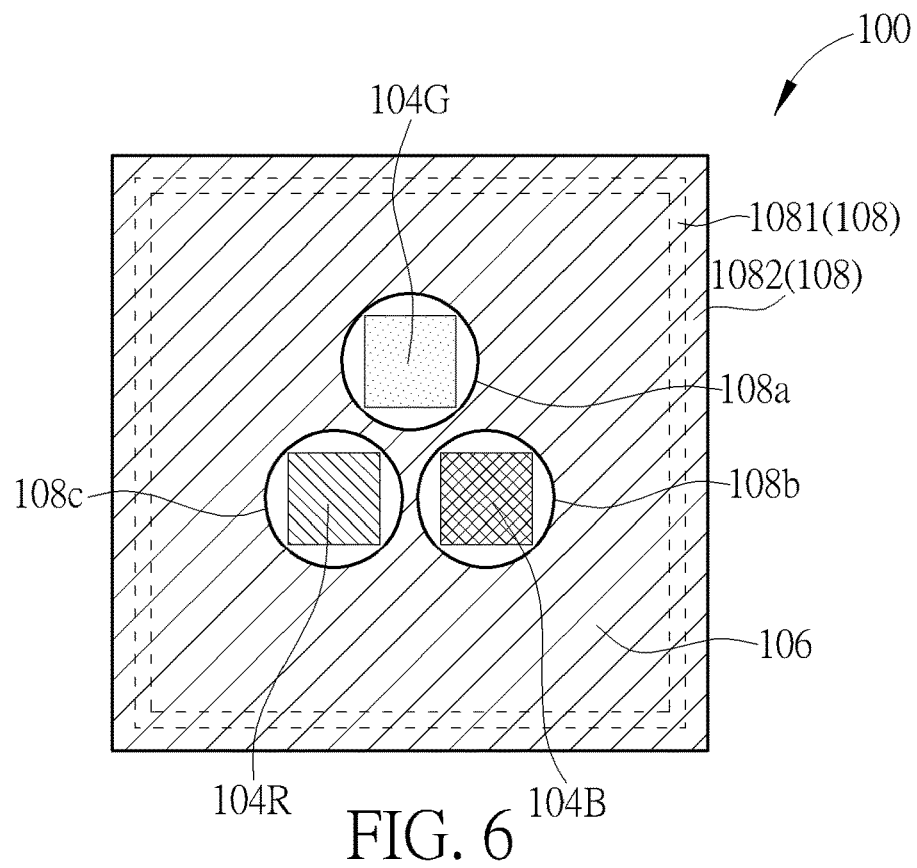
FIG. 6 is a schematic top view of a light emitting element according to a third embodiment of the present disclosure.

Referring to FIG. 6, FIG. 6 is a schematic top view of a light emitting element according to a third embodiment of the present disclosure. This embodiment is mainly different from the second embodiment and variant embodiments shown in FIG. 3, FIG. 4 and FIG. 5 in that the light-shielding layer 108 includes three openings 108a, 108b, 108c corresponding to the light-emitting diode chips 104G, 104B, 104R respectively. Specifically, the locations of the openings 108a, 108b, 108c respectively correspond to the locations of the light-emitting diode chips 104G, 104B, 104R in a top-view direction. In other words, the openings 108a, 108b, 108c are disposed corresponding to the light-emitting diode chips 104G, 104B, 104R respectively. In this embodiment, the areas of the openings 108a, 108b, 108c are greater than the areas of the light-emitting diode chips 104G, 104B, 104R respectively in the top-view direction, and the openings 108a, 108b, 108c at least partially overlap the light-emitting diode chips 104G, 104B, 104R respectively. Therefore, most of the lights produced by the light-emitting diode chips 104G, 104B, 104R can emit through the openings 108a, 108b, 108c directly, and a less portion of the lights will be reflected by the light reflective layer 1081 of the light-shielding layer 108 before emitting out through the openings 108a, 108b, 108c. This design may improve the whole light emitting luminance. In a variant embodiment of this embodiment, the areas of the openings 108a, 108b, 108c may be less than the projection areas of the light-emitting diode chips 104G, 104B, 104R. When the openings 108a, 108b, 108c is designed to occupy a less area of the top of the light emitting element 100, which means the light absorption layer 1082 occupies a greater area at the top of the light emitting element 100, the reflection of the ambient light may be reduced and thus the contrast ratio of the displayed image may be increased.

Figure 7:
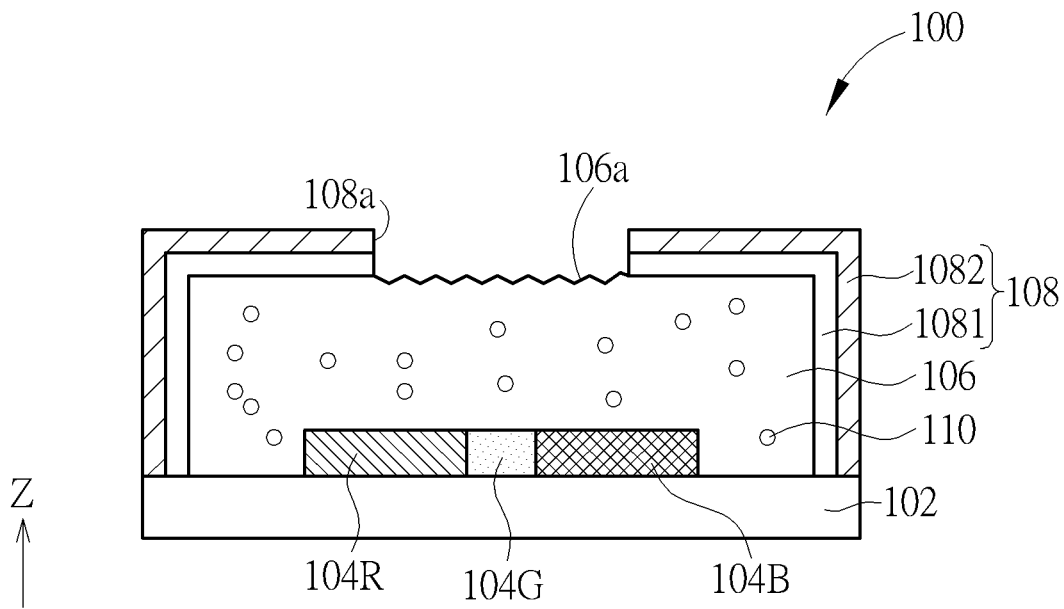
FIG. 7 is a schematic sectional-view of alight emitting element according to a fourth embodiment of the present disclosure.

Referring to FIG. 7, FIG. 7 is a schematic sectional-view of a light emitting element according to a fourth embodiment of the present disclosure. The relative disposition of the light-emitting diode chips 104G, 104B, 104R in this embodiment in the top-view direction may refer to FIG. 4. The main difference between this embodiment and the aforementioned embodiments is that the encapsulation material 106 shown in FIG. 7 may be doped by particles 110 in order to further improve the light mixing effect in the encapsulation material 106. The particles 110 may include scattering particles, diffusing particles, reflective particles, refraction particles, other particles that can modulate light profiles, or any combinations thereof, but not limited thereto. In some embodiments, the encapsulation material 106 may further include the materials which can modify the color of light, and these materials may be quantum dots, fluorescent powders, and/or phosphor powders for example. In addition, the encapsulation material 106 of this embodiment exposed by the opening 108a may have a micro-structure 106a, such as regular or random texture or toughness. The micro-structure 106a may improve the scattering effect such that the encapsulation material 106 at the opening 108a may reflect less ambient light. The particles 110 and the micro-structure 106a in this embodiment may be applied to other embodiments and variations of the present disclosure individually or at the same time. For examples, in some embodiments, the encapsulation material 106 of the light emitting element 100 may include the particles 110 but do not have the micro-structure 106a on its surface, and in some other embodiments, the surface of the encapsulation material 106 of the light emitting element 100 may have the micro-structure 106a, but do not have particles 110 doped therein.

Figure 8:
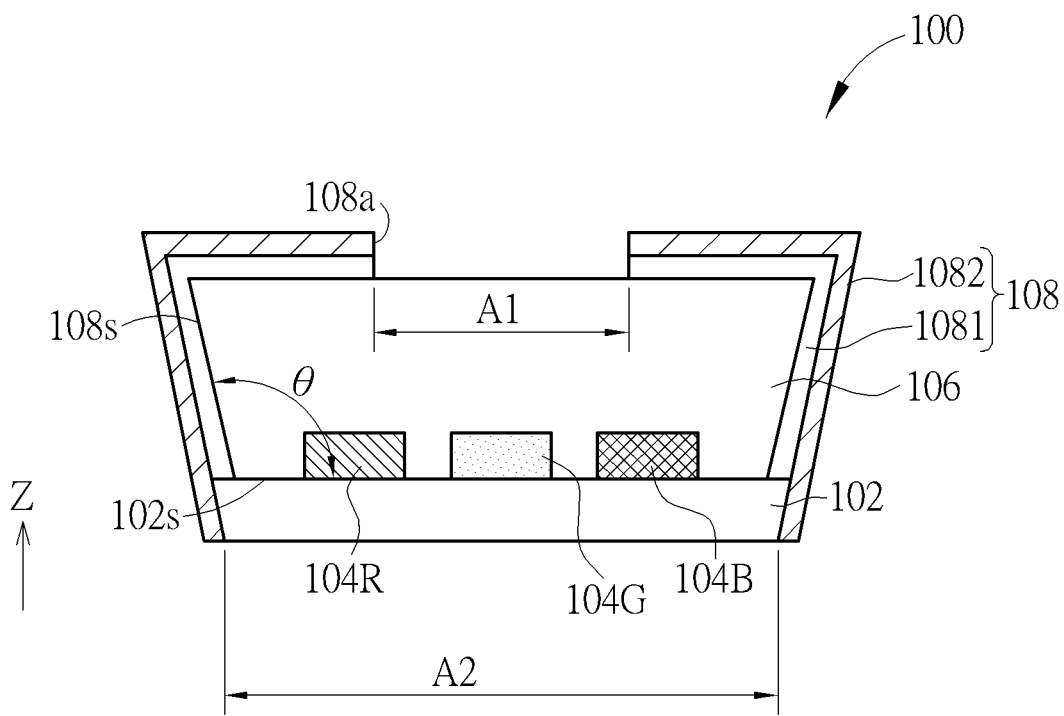
FIG. 8 is a schematic sectional-view of a light emitting element according to a fifth embodiment of the present disclosure.

Referring to FIG. 8, FIG. 8 is a schematic sectional-view of a light emitting element according to a fifth embodiment of the present disclosure. This embodiment is different from the previous embodiments mainly in that the inner sidewall 108s of the light-shielding layer 108 of the light emitting element 100 has an inclined angle with respect to the top surface 102s of the package substrate. In some embodiments, the top surface 102s of the package substrate 102 and the inner sidewall 108s of the light-shielding layer 108 may have an inner included angle θ which may be greater than 90° and less than 180°. This design may reduce the number of times that the light is reflected in the encapsulation material 106 and the light may emit out through the opening 108a with less reflection times. Accordingly, the light emitting efficiency may be increased. In some other embodiments, the top surface 102s of the package substrate 102 and the inner sidewall 108s of the light-shielding layer 108 may have an inner included angle θ ranging from 0° to 90° (0°<inner included angle θ≤90°.

Figure 9:
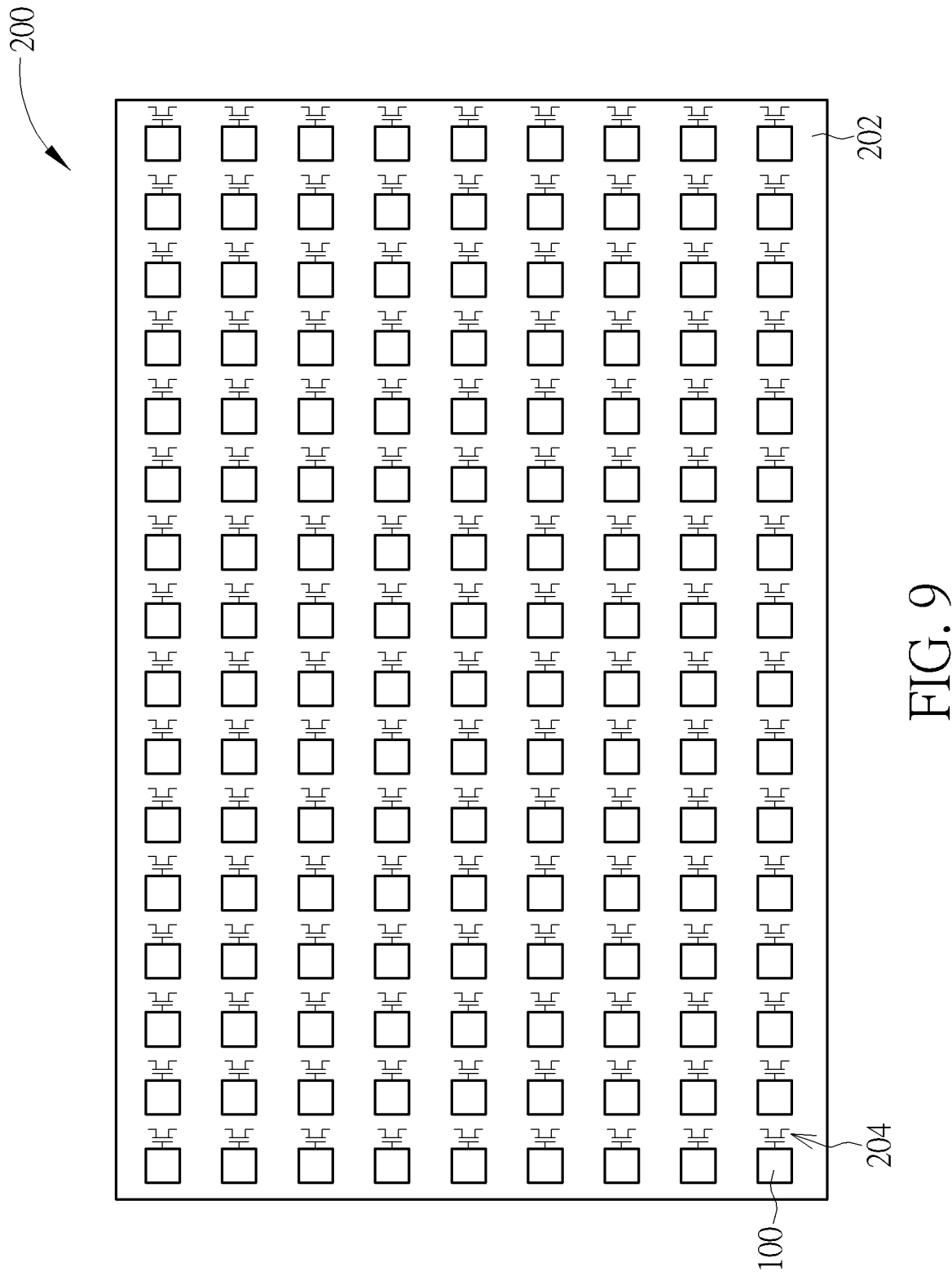
FIG. 9 is a schematic top view of an electronic device according to the present disclosure.
Figure 10:
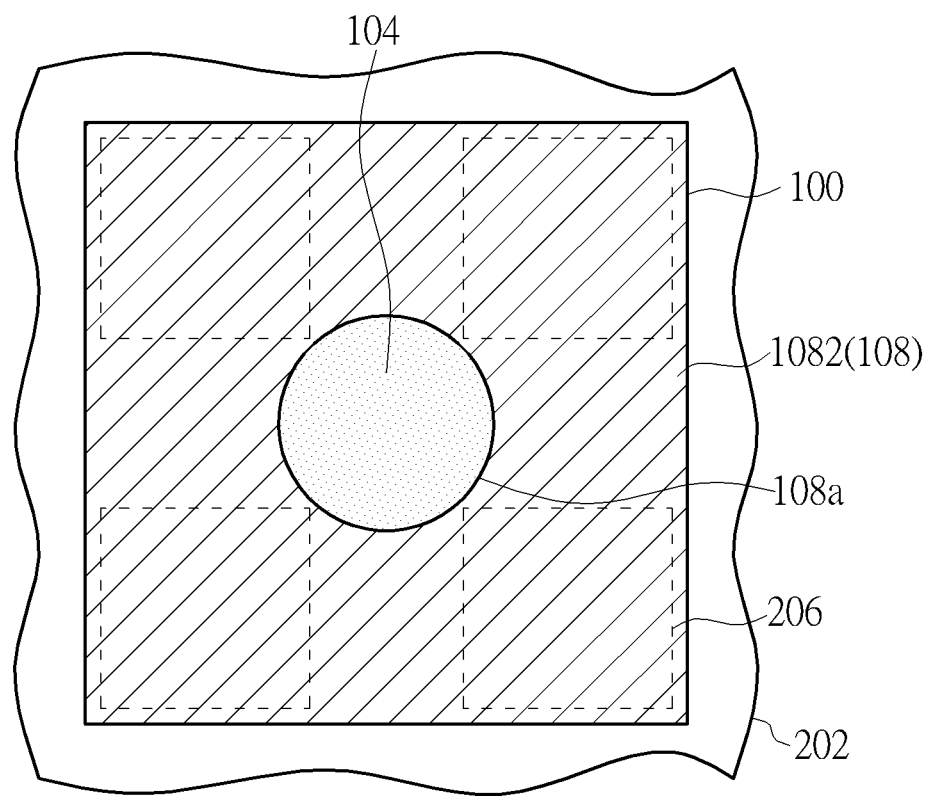
FIG. 10 is a schematic partial-enlarged diagram of the electronic device according to the present disclosure.

Referring to FIG. 9 and FIG. 10, FIG. 9 is a schematic top view of an electronic device according to the present disclosure, and FIG. 10 is a schematic partial-enlarged diagram of the electronic device according to the present disclosure. The above-mentioned light emitting elements 100 of the present disclosure may be applied to various electronic devices 200. The electronic device 200 may be a display, such as a spliced display or a flexible display, but not limited thereto. In some embodiments, the electronic device 200 of the present disclosure may be an LED display panel, such as a PID. In some embodiments, the electronic device 200 may be a light emitting device that can serve as a back light source or a backlight module of a non-self-emitting display panel. However, the electronic device 200 of the present disclosure is not limited to the aforementioned examples. The electronic device 200 of this embodiment of the present disclosure is a PID and includes a main substrate 202 and at least a light emitting element 100. The main substrate 202 includes at least a circuit 204 (a plurality of circuits 204 shown) and a plurality of connection pads 206, wherein the circuit 204 and the plurality of connection pads 206 are both disposed on the surface of the main substrate 202. The circuit 204 may include thin film transistor (s), conductive line(s), capacitor(s) or other suitable electronic elements. The symbol of transistor is used for representing the circuit 204 in FIG. 9. In FIG. 10, the connection pads 206 may comprise metal material or any suitable conductive material. The light emitting element 100 is disposed on the main substrate 202 and electrically connected with the circuit 204 through the connection pads 206. The light emitting element 100 in FIG. 9 and FIG. 10 is the light emitting element 100 shown in FIG. 1 and FIG. 2 as an example, but not limited thereto. All of the light emitting elements 100 mentioned in the previous embodiments and variant embodiments can be applied to the electronic device 200 of the present disclosure, thus the details of the structure of the light emitting element 100 is not repeated. In this embodiment, the electronic device 200 may include a plurality of light emitting element 100, arranged in an array on the surface of the main substrate 202. The connection pads on the bottom of the light emitting element 100 may be electrically connected with the connection pads 206 therebelow through solder materials or other connection method. According to the present disclosure, the disposition range of the connection pads 206 is less than the area of the corresponding light emitting element 100 projected onto the main substrate 202. In other words, in a top-view direction, the light emitting element 100 covers and electrically connects to the connection pads 206, and the connection pads 206 are not exposed in the top-view direction. In other embodiments, most portions of the connection pads 206 may be covered by the light emitting element 100 while a small part of the connection pads 206 may be exposed by the light emitting element 100. This design may reduce the exposed portion of the connection pads 206 that include metal material, thus the probability that the connection pads 206 reflect ambient light may be reduced. The image contrast ratio may thereby be improved.

From the above, the light emitting element of the present disclosure has a light-shielding layer surrounding the encapsulation material with high light transmittance, and the light-shielding layer has an opening allowing light to pass through, thus the light of the light emitting element can be concentrated to the opening to emit out of the light emitting element. The inner layer of the light-shielding layer is a light reflective layer which can increase the amount of light emitting through the opening and increase the light utilization ratio. When the light emitting element includes a plurality of light-emitting diode chips producing lights with different colors, the light reflective layer can improve the light mixing effect. The outer layer of the light-shielding layer is a light absorption layer, and therefore the reflective ratio of ambient light can be decreased. Accordingly, the interference from the ambient light to the emitted light of the light emitting element may be reduced. The contrast ratio may be raised. When the light emitting element of the present disclosure is applied to an electronic device, the light utilization ratio or contrast ratio of the display image may be improved since it can decrease the reflection of ambient light. In addition, since the connection pads disposed on the main substrate surface of the electronic device are covered by the corresponding light emitting element, the reflection of ambient light may be further reduced, so as to improve the image quality.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A light emitting element, comprising:
   a package substrate;
   a first light-emitting diode chip disposed on the package substrate;
   an encapsulation material disposed on the light-emitting diode chip and the package substrate;

a plurality of scattering particles, diffusing particles, reflective particles, refraction particles, or other particles that can modulate light-emitting profile or a combination thereof disposed in the encapsulation material; and a light-shielding layer covering and enclosing the encapsulation material, the light-shielding layer having a first opening, wherein the light-shielding layer comprises a light reflective layer and a light absorption layer, the light reflective layer is disposed between the light absorption layer and the encapsulation material, the first opening exposes a portion of the encapsulation material, and the portion of the encapsulation material has a micro-structure on a surface of the encapsulation material;

wherein in a top-view, an area of the first opening is less than an area of the light emitting element.

2. The light emitting element of claim 1, wherein the first opening is disposed corresponding to the first light-emitting diode chip.

3. The light emitting element of claim 1, further comprising a second light-emitting diode chip disposed on the package substrate, wherein in the top-view direction, the first opening overlaps at least a portion of the first light-emitting diode chip and the second light-emitting diode chip.

4. The light emitting element of claim 1, further comprising a second light-emitting diode chip disposed on the package substrate, wherein the light-shielding layer includes a second opening, and the second opening is disposed corresponding to the second light-emitting diode chip.

5. The light emitting element of claim 4, wherein the first light-emitting diode chip and the second light-emitting diode chip respectively produce lights with different colors.

6. The light emitting element of claim 4, wherein the first opening exposes a portion of the first light-emitting diode chip and the second opening expose a portion of the second light-emitting diode chip.

7. The light emitting element of claim 1, wherein an inner included angle between the package substrate and the light-shielding layer is greater than 90° and less than 180°.

8. An electronic device, comprising:
a main substrate, including a circuit and a plurality of connection pads disposed on a surface of the main substrate; and
a light emitting element disposed on the main substrate and electrically connected with at least one of the plurality of the connection pads, the light emitting element including:
a package substrate;
a first light-emitting diode chip disposed on the package substrate;
an encapsulation material disposed on the first light-emitting diode chip and the package substrate; and
a light-shielding layer covering and enclosing the encapsulation material and having a first opening, wherein the light-shielding layer comprises a light reflective layer and a light absorption layer, the light reflective layer is disposed between the light absorption layer and the encapsulation material, the first opening exposes a portion of the encapsulation material, and the portion of the encapsulation material has a micro-structure on a surface of the encapsulation material;

wherein in a top-view, an area of the first opening is less than an area of the light emitting element.

9. The electronic device of claim 8, wherein in the top-view direction, the light emitting element overlaps the at least one of the plurality of the connection pads electrically connected with the light emitting element.

10. The electronic device of claim 8, wherein the first opening is disposed corresponding to the first light-emitting diode chip.

11. The electronic device of claim 8, further comprising a second light-emitting diode chip disposed on the package substrate, wherein in the top-view direction, the first opening overlaps at least a portion of the first light-emitting diode chip and the second light-emitting diode chip.

12. The electronic device of claim 8, further comprising a second light-emitting diode chip disposed on the package substrate, wherein the light-shielding layer includes a second opening, and the second opening is disposed corresponding to the second light-emitting diode chip.

13. The electronic device of claim 12, wherein the first light-emitting diode chip and the second light-emitting diode chip respectively produce lights with different colors.

14. The electronic device of claim 8, further comprising a plurality of scattering particles, diffusing particles, reflective particles, refraction particles, or other particles that can modulate light-emitting profile or a combination thereof disposed in the encapsulation material.

15. The electronic device of claim 8, wherein an inner included angle between the package substrate and the light-shielding layer is greater than 90° and less than 180°.

16. A light emitting element, comprising:
a package substrate;
a first light-emitting diode chip disposed on the package substrate;
an encapsulation material disposed on the light-emitting diode chip and the package substrate; and
a light-shielding layer disposed on a top surface and a side surface of the encapsulation material, and having a first opening, wherein the light-shielding layer comprises a light reflective layer and a light absorption layer, the light reflective layer is disposed between the light absorption layer and the encapsulation material, the first opening exposes a portion of the encapsulation material, and in a top-view, an area of the first opening is less than an area of the light emitting element.

* * * * *